(12) United States Patent
Chen et al.

(10) Patent No.: US 10,979,002 B2
(45) Date of Patent: Apr. 13, 2021

(54) CURRENT-LIMITING CIRCUIT FOR A POWER AMPLIFIER

(71) Applicant: QUALCOMM Incorporated, San Diego, CA (US)

(72) Inventors: Jing-Hwa Chen, Sudbury, MA (US); Jisun Ryu, Sudbury, MA (US); Yan Kit Gary Hau, Westford, MA (US); Yanjie Sun, Lexington, MA (US); Xinwei Wang, Dunstable, MA (US); Xiangdong Zhang, Westford, MA (US)

(73) Assignee: QUALCOMM INCORPORATED, San Diego, CA (US)

( * ) Notice: Subject to any disclaimer, the term of this patent is extended or adjusted under 35 U.S.C. 154(b) by 0 days.

(21) Appl. No.: 16/031,834

(22) Filed: Jul. 10, 2018

(65) Prior Publication Data
US 2019/0020317 A1    Jan. 17, 2019

Related U.S. Application Data

(60) Provisional application No. 62/531,181, filed on Jul. 11, 2017.

(51) Int. Cl.
*H03F 1/52* (2006.01)
*H03F 3/191* (2006.01)
(Continued)

(52) U.S. Cl.
CPC ............ *H03F 1/523* (2013.01); *G05F 3/225* (2013.01); *H03F 1/0266* (2013.01); *H03F 1/303* (2013.01);
(Continued)

(58) Field of Classification Search
CPC . H03F 3/21; H03F 3/245; H03F 3/191; H03F 1/52; H03F 1/32; H03F 1/303; H03F 1/0266
(Continued)

(56) References Cited

U.S. PATENT DOCUMENTS 7,362,871 B2    4/2008 Inagaki
8,253,492 B2 *  8/2012 Hijikata ............... H03F 1/0277
                                                        330/285

(Continued)

FOREIGN PATENT DOCUMENTS

JP        2007018377 A     1/2007

OTHER PUBLICATIONS

International Search Report and Written Opinion—PCT/US2018/041606—ISA/EPO—dated Oct. 9, 2018.
(Continued)

*Primary Examiner* — Khanh V Nguyen
*Assistant Examiner* — Khiem D Nguyen
(74) *Attorney, Agent, or Firm* — Qualcomm Incorporated

(57) ABSTRACT

Certain aspects of the present disclosure provide methods and apparatus for current-limiting protection of an amplifier, such as a power amplifier in a radio frequency (RF) front-end. One example current-limiting circuit generally includes a node coupled to a current source, a plurality of current-sinking devices coupled to the node, one or more switches coupled between the node and at least one of the plurality of current-sinking devices, and a bias circuit having an input coupled to the node and an output for coupling to an input of the amplifier.

26 Claims, 6 Drawing Sheets

(51) Int. Cl.
  *H03F 1/30* (2006.01)
  *H03F 3/24* (2006.01)
  *H03F 1/32* (2006.01)
  *G05F 3/22* (2006.01)
  *H03F 1/02* (2006.01)
  *H03F 3/21* (2006.01)

(52) U.S. Cl.
  CPC ............ *H03F 1/32* (2013.01); *H03F 1/52* (2013.01); *H03F 3/191* (2013.01); *H03F 3/21* (2013.01); *H03F 3/245* (2013.01); *H03F 2200/18* (2013.01); *H03F 2200/21* (2013.01); *H03F 2200/27* (2013.01); *H03F 2200/444* (2013.01); *H03F 2200/447* (2013.01); *H03F 2200/451* (2013.01); *H03F 2200/504* (2013.01)

(58) Field of Classification Search
  USPC ........................................... 330/51, 289, 296
  See application file for complete search history.

(56) References Cited

U.S. PATENT DOCUMENTS

| | | |
|---|---|---|
| 8,258,876 B1 | 9/2012 | Osika et al. |
| 9,337,787 B2* | 5/2016 | Schooley ............... H03F 3/21 |
| 2011/0187459 A1 | 8/2011 | Matsuzuka et al. |
| 2012/0269240 A1 | 10/2012 | Balteanu et al. |
| 2016/0065142 A1 | 3/2016 | Paek et al. |
| 2016/0099688 A1 | 4/2016 | Quaglietta et al. |

OTHER PUBLICATIONS

Taniguchi E., et al., "A Dual Bias-Feed Circuit Design for SiGe HBT Low-Noise Linear Amplifier," IEEE Transactions on Microwave Theory and Techniques, Plenum, USA, vol. 51, No. 2, Feb. 1, 2003, XP011076896, ISSN: 0018-9480, pp. 414-421.

\* cited by examiner

CURRENT-LIMITING CIRCUIT FOR A POWER AMPLIFIER

CLAIM OF PRIORITY UNDER 35 U.S.C. § 119

The present application claims the benefit of U.S. Provisional Patent Application Ser. No. 62/531,181, filed Jul. 11, 2017 and entitled "Current-Limiting Circuit for a Power Amplifier," which is herein incorporated by reference in its entirety.

TECHNICAL FIELD

Certain aspects of the present disclosure generally relate to electronic circuits and, more particularly, to current-limiting circuits.

BACKGROUND

Wireless communication networks are widely deployed to provide various communication services such as telephony, video, data, messaging, broadcasts, and so on. Such networks, which are usually multiple access networks, support communications for multiple users by sharing the available network resources. For example, one network may be a 3G (the third generation of mobile phone standards and technology) system, which may provide network service via any one of various 3G radio access technologies (RATs) including EVDO (Evolution-Data Optimized), 1×RTT (1 times Radio Transmission Technology, or simply 1×), W-CDMA (Wideband Code Division Multiple Access), UMTS-TDD (Universal Mobile Telecommunications System-Time Division Duplexing), HSPA (High Speed Packet Access), GPRS (General Packet Radio Service), or EDGE (Enhanced Data rates for Global Evolution). The 3G network is a wide area cellular telephone network that evolved to incorporate high-speed internet access and video telephony, in addition to voice calls. Furthermore, a 3G network may be more established and provide larger coverage areas than other network systems. Such multiple access networks may also include code division multiple access (CDMA) systems, time division multiple access (TDMA) systems, frequency division multiple access (FDMA) systems, orthogonal frequency division multiple access (OFDMA) systems, single-carrier FDMA (SC-FDMA) networks, 3rd Generation Partnership Project (3GPP) Long Term Evolution (LTE) networks, and Long Term Evolution Advanced (LTE-A) networks.

A wireless communication network may include a number of base stations that can support communication for a number of mobile stations. A mobile station (MS) may communicate with a base station (BS) via a downlink and an uplink. The downlink (or forward link) refers to the communication link from the base station to the mobile station, and the uplink (or reverse link) refers to the communication link from the mobile station to the base station. A base station may transmit data and control information on the downlink to a mobile station and/or may receive data and control information on the uplink from the mobile station. The base station and/or the mobile station may include a radio frequency front-end with a power amplifier coupled to one or more antennas for transmission.

SUMMARY

Certain aspects of the present disclosure generally relate to current-limiting circuits, such as circuits for current-limiting protection of an amplifier (e.g., a power amplifier in a radio frequency front-end of a wireless device).

Certain aspects of the present disclosure provide a current-limiting circuit for an amplifier. The circuit generally includes a node coupled to a current source, a plurality of current-sinking devices coupled to the node, one or more switches coupled between the node and at least one of the plurality of current-sinking devices, and a bias circuit having an input coupled to the node and an output for coupling to an input of the amplifier.

Certain aspects of the present disclosure provide a method of current-limiting an amplifier. The method generally includes sourcing a supply current to a node, the node being coupled to a plurality of current-sinking devices; supplying a bias current to an input of the amplifier via a bias circuit having an input coupled to the node and an output coupled to the input of the amplifier; and selectively closing one or more switches coupled between the node and at least one of the plurality of current-sinking devices to adjust a reference current derived from the supply current, the reference current limiting an input current for the bias circuit to be no greater than the reference current, the input current for the bias circuit being based on the bias current.

Certain aspects of the present disclosure provide an apparatus. The apparatus generally includes means for amplifying a radio frequency signal, means for supplying a substantially constant current, means for adjustably sinking current supplied by the means for supplying the substantially constant current, and means for biasing the means for amplifying, the means for biasing being coupled between the means for adjustably sinking current and the means for amplifying.

BRIEF DESCRIPTION OF THE DRAWINGS

So that the manner in which the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects.

DETAILED DESCRIPTION

Figure 1:
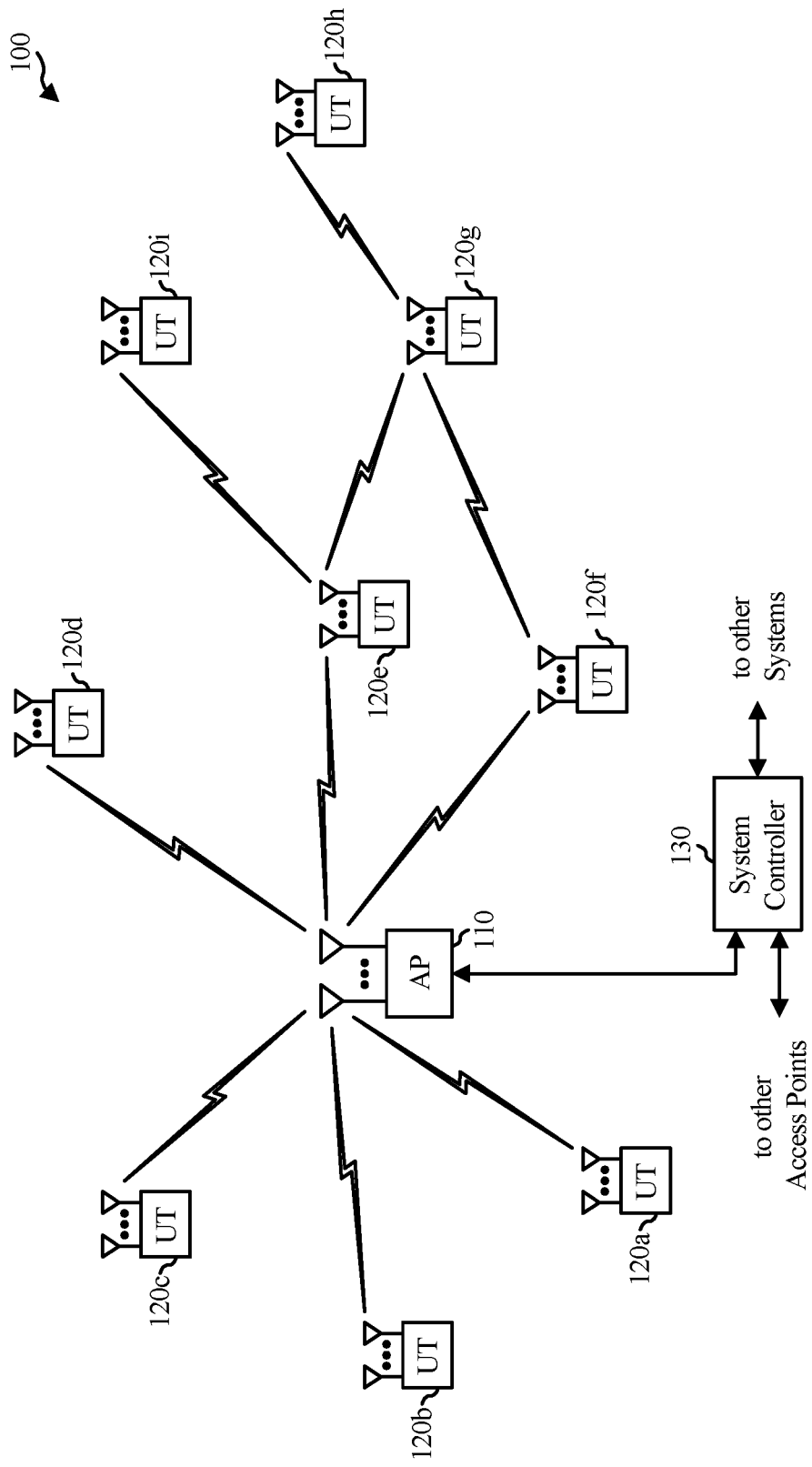
FIG. 1 is a diagram of an example wireless communications network, in accordance with certain aspects of the present disclosure.

Various aspects of the disclosure are described more fully hereinafter with reference to the accompanying drawings. This disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. Based on the teachings herein one skilled in the art should appreciate that the scope of the disclosure is intended to cover any aspect of the disclosure disclosed herein, whether implemented independently of or combined with any other aspect of the disclosure. For example, an apparatus may be implemented or a method may be practiced using any number of the aspects set forth herein. In addition, the scope of the disclosure is intended to cover such an apparatus or method which is practiced using other structure, functionality, or structure and functionality in addition to or other than the various aspects of the disclosure set forth herein. It should be understood that any aspect of the disclosure disclosed herein may be embodied by one or more elements of a claim.

The word "exemplary" is used herein to mean "serving as an example, instance, or illustration." Any aspect described herein as "exemplary" is not necessarily to be construed as preferred or advantageous over other aspects.

As used herein, the term "connected with" in the various tenses of the verb "connect" may mean that element A is directly connected to element B or that other elements may be connected between elements A and B (i.e., that element A is indirectly connected with element B). In the case of electrical components, the term "connected with" may also be used herein to mean that a wire, trace, or other electrically conductive material is used to electrically connect elements A and B (and any components electrically connected therebetween).

The techniques described herein may be used in combination with various wireless technologies such as Code Division Multiple Access (CDMA), Orthogonal Frequency Division Multiplexing (OFDM), Time Division Multiple Access (TDMA), Spatial Division Multiple Access (SDMA), Single Carrier Frequency Division Multiple Access (SC-FDMA), Time Division Synchronous Code Division Multiple Access (TD-SCDMA), and so on. Multiple user terminals can concurrently transmit/receive data via different (1) orthogonal code channels for CDMA, (2) time slots for TDMA, or (3) sub-bands for OFDM. A CDMA system may implement IS-2000, IS-95, IS-856, Wideband-CDMA (W-CDMA), or some other standards. An OFDM system may implement Institute of Electrical and Electronics Engineers (IEEE) 802.11, IEEE 802.16, Long Term Evolution (LTE) (e.g., in TDD and/or FDD modes), or some other standards (e.g., 5G). A TDMA system may implement Global System for Mobile Communications (GSM) or some other standards. In some implementations, the techniques described herein may be used in combination with a wireless local area network (WLAN), for example utilizing a WiFi standard, such as one of the IEEE 802.11 standards. These various standards are known in the art.

An Example Wireless System

FIG. 1 illustrates a wireless communications system 100 with access points 110 and user terminals 120, in which aspects of the present disclosure may be practiced. For simplicity, only one access point 110 is shown in FIG. 1. An access point (AP) is generally a fixed station that communicates with the user terminals and may also be referred to as a base station (BS), an evolved Node B (eNB), or some other terminology. A user terminal (UT) may be fixed or mobile and may also be referred to as a mobile station (MS), an access terminal, user equipment (UE), a station (STA), a client, a wireless device, or some other terminology. A user terminal may be a wireless device, such as a cellular phone, a personal digital assistant (PDA), a handheld device, a wireless modem, a laptop computer, a tablet, a personal computer, etc.

Access point 110 may communicate with one or more user terminals 120 at any given moment on the downlink and uplink. The downlink (i.e., forward link) is the communication link from the access point to the user terminals, and the uplink (i.e., reverse link) is the communication link from the user terminals to the access point. A user terminal may also communicate peer-to-peer with another user terminal. A system controller 130 couples to and provides coordination and control for the access points.

System 100 may employ multiple transmit and multiple receive antennas for data transmission on the downlink and uplink. For example, access point 110 may be equipped with a number $N_{ap}$ of antennas to achieve transmit diversity for downlink transmissions and/or receive diversity for uplink transmissions. A set $N_u$ of selected user terminals 120 may receive downlink transmissions and transmit uplink transmissions. Each selected user terminal transmits user-specific data to and/or receives user-specific data from the access point. In general, each selected user terminal may be equipped with one or multiple antennas (i.e., $N_{ut} \geq 1$). The $N_u$ selected user terminals can have the same or different number of antennas.

Wireless system 100 may be a time division duplex (TDD) system or a frequency division duplex (FDD) system. For a TDD system, the downlink and uplink share the same frequency band. For an FDD system, the downlink and uplink use different frequency bands. System 100 may also utilize a single carrier or multiple carriers for transmission. Each user terminal 120 may be equipped with a single antenna (e.g., in order to keep costs down) or multiple antennas (e.g., where the additional cost can be supported).

The access point 110 and/or user terminal 120 may include a current-limiting circuit coupled to a power amplifier, in accordance with certain aspects of the present disclosure.

Figure 2:
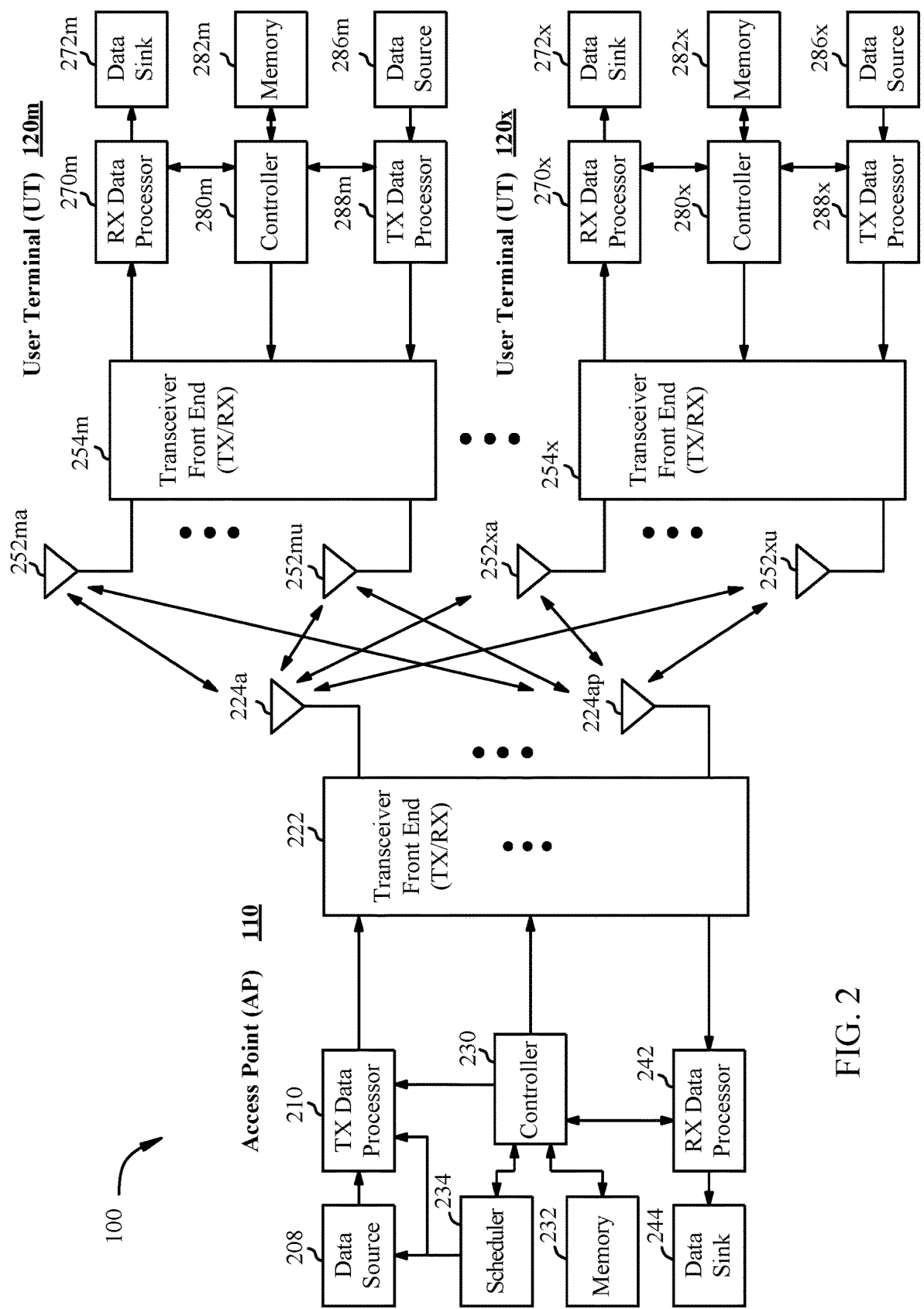
FIG. 2 is a block diagram of an example access point (AP) and example user terminals, in accordance with certain aspects of the present disclosure.

FIG. 2 shows a block diagram of access point 110 and two user terminals 120m and 120x in wireless system 100. Access point 110 is equipped with $N_{ap}$ antennas 224a through 224ap. User terminal 120m is equipped with $N_{ut,m}$ antennas 252ma through 252mu, and user terminal 120x is equipped with $N_{ut,x}$ antennas 252xa through 252xu. Access point 110 is a transmitting entity for the downlink and a receiving entity for the uplink. Each user terminal 120 is a transmitting entity for the uplink and a receiving entity for the downlink. As used herein, a "transmitting entity" is an independently operated apparatus or device capable of transmitting data via a frequency channel, and a "receiving entity" is an independently operated apparatus or device capable of receiving data via a frequency channel. In the following description, the subscript "dn" denotes the downlink, the subscript "up" denotes the uplink, $N_{up}$ user terminals are selected for simultaneous transmission on the uplink, $N_{dn}$ user terminals are selected for simultaneous transmission on the downlink, $N_{up}$ may or may not be equal to $N_{dn}$, and $N_{up}$ and $N_{dn}$ may be static values or can change for each scheduling interval. Beam-steering or some other spatial processing technique may be used at the access point and user terminal.

On the uplink, at each user terminal 120 selected for uplink transmission, a TX data processor 288 receives traffic data from a data source 286 and control data from a controller 280. TX data processor 288 processes (e.g., encodes, interleaves, and modulates) the traffic data $\{d_{up}\}$ for the user terminal based on the coding and modulation schemes associated with the rate selected for the user terminal and provides a data symbol stream $\{s_{up}\}$ for one of the $N_{ut,m}$ antennas. A transceiver front-end (TX/RX) 254 (also known as a radio frequency front-end (RFFE)) receives and processes (e.g., converts to analog, amplifies, filters, and frequency upconverts) a respective symbol stream to generate an uplink signal. The transceiver front-end 254 may also route the uplink signal to one of the $N_{ut,m}$ antennas for transmit diversity via an RF switch, for example. The controller 280 may control the routing within the transceiver front-end 254. Memory 282 may store data and program codes for the user terminal 120 and may interface with the controller 280.

A number $N_{up}$ of user terminals 120 may be scheduled for simultaneous transmission on the uplink. Each of these user terminals transmits its set of processed symbol streams on the uplink to the access point.

At access point 110, $N_{ap}$ antennas 224a through 224ap receive the uplink signals from all $N_{up}$ user terminals transmitting on the uplink. For receive diversity, a transceiver front-end 222 may select signals received from one of the antennas 224 for processing. The signals received from multiple antennas 224 may be combined for enhanced receive diversity. The access point's transceiver front-end 222 also performs processing complementary to that performed by the user terminal's transceiver front-end 254 and provides a recovered uplink data symbol stream. The recovered uplink data symbol stream is an estimate of a data symbol stream $\{s_{up}\}$ transmitted by a user terminal. An RX data processor 242 processes (e.g., demodulates, deinterleaves, and decodes) the recovered uplink data symbol stream in accordance with the rate used for that stream to obtain decoded data. The decoded data for each user terminal may be provided to a data sink 244 for storage and/or a controller 230 for further processing.

The transceiver front-end (TX/RX) 222 of access point 110 and/or transceiver front-end 254 of user terminal 120 may include a current-limiting circuit coupled to a power amplifier, in accordance with certain aspects of the present disclosure.

On the downlink, at access point 110, a TX data processor 210 receives traffic data from a data source 208 for $N_{dn}$ user terminals scheduled for downlink transmission, control data from a controller 230 and possibly other data from a scheduler 234. The various types of data may be sent on different transport channels. TX data processor 210 processes (e.g., encodes, interleaves, and modulates) the traffic data for each user terminal based on the rate selected for that user terminal. TX data processor 210 may provide a downlink data symbol streams for one of more of the $N_{dn}$ user terminals to be transmitted from one of the $N_{ap}$ antennas. The transceiver front-end 222 receives and processes (e.g., converts to analog, amplifies, filters, and frequency upconverts) the symbol stream to generate a downlink signal. The transceiver front-end 222 may also route the downlink signal to one or more of the $N_{ap}$ antennas 224 for transmit diversity via an RF switch, for example. The controller 230 may control the routing within the transceiver front-end 222.

Memory 232 may store data and program codes for the access point 110 and may interface with the controller 230.

At each user terminal 120, $N_{ut,m}$ antennas 252 receive the downlink signals from access point 110. For receive diversity at the user terminal 120, the transceiver front-end 254 may select signals received from one of the antennas 252 for processing. The signals received from multiple antennas 252 may be combined for enhanced receive diversity. The user terminal's transceiver front-end 254 also performs processing complementary to that performed by the access point's transceiver front-end 222 and provides a recovered downlink data symbol stream. An RX data processor 270 processes (e.g., demodulates, deinterleaves, and decodes) the recovered downlink data symbol stream to obtain decoded data for the user terminal. The decoded data for the user terminal may be provided to a data sink 272 for storage and/or a controller 280 for further processing.

Those skilled in the art will recognize the techniques described herein may be generally applied in systems utilizing any type of multiple access schemes, such as TDMA, SDMA, Orthogonal Frequency Division Multiple Access (OFDMA), CDMA, SC-FDMA, TD-SCDMA, and combinations thereof.

Figure 3:
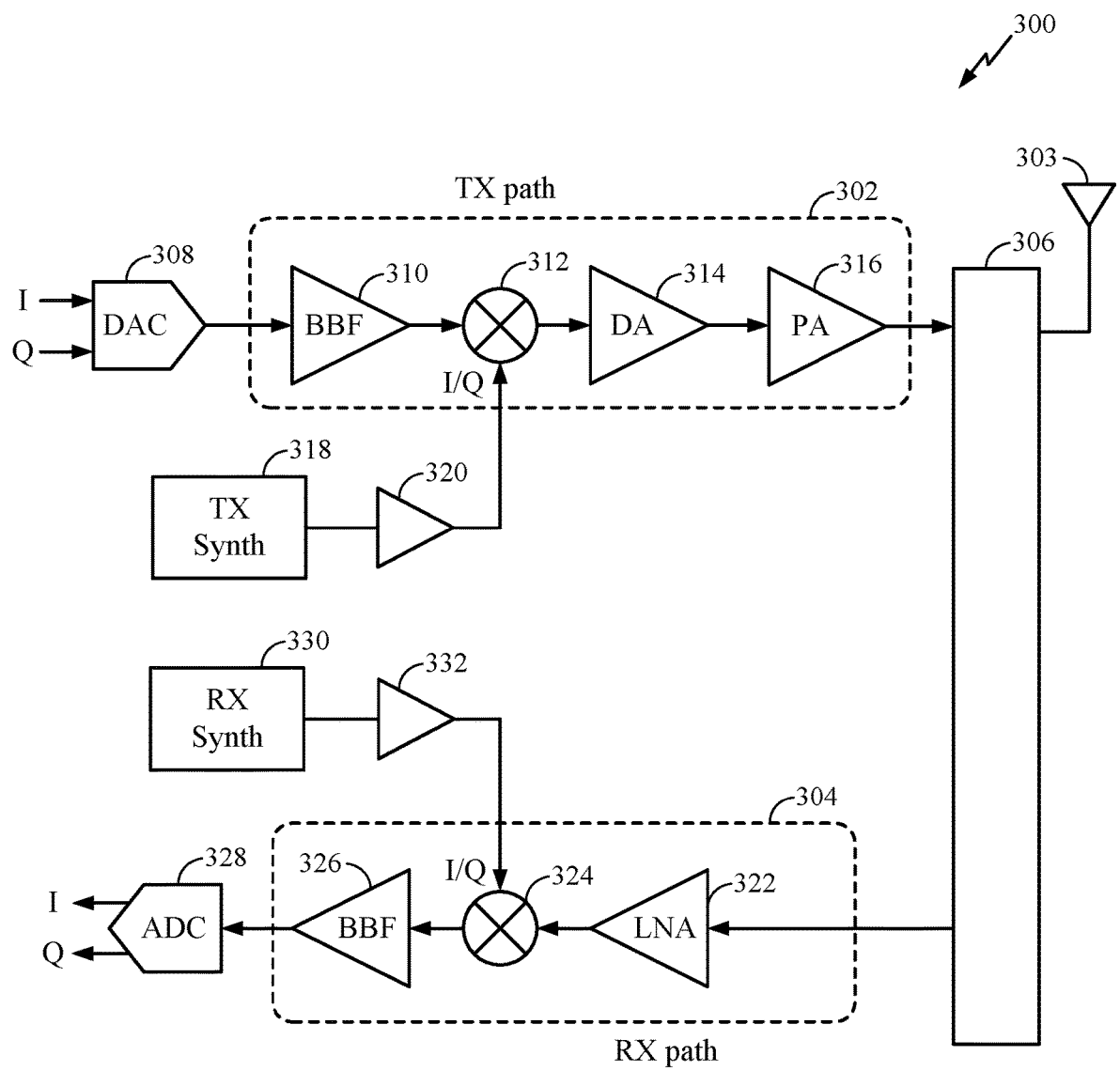
FIG. 3 is a block diagram of an example transceiver front-end, in accordance with certain aspects of the present disclosure.

FIG. 3 is a block diagram of an example transceiver front-end 300, such as transceiver front-ends 222, 254 in FIG. 2, in which aspects of the present disclosure may be practiced. The transceiver front-end 300 includes a transmit (TX) path 302 (also known as a transmit chain) for transmitting signals via one or more antennas and a receive (RX) path 304 (also known as a receive chain) for receiving signals via the antennas. When the TX path 302 and the RX path 304 share an antenna 303, the paths may be connected with the antenna via an interface 306, which may include any of various suitable RF devices, such as a duplexer, a switch, a diplexer, and the like.

Receiving in-phase (I) or quadrature (Q) baseband analog signals from a digital-to-analog converter (DAC) 308, the TX path 302 may include a baseband filter (BBF) 310, a mixer 312, a driver amplifier (DA) 314, and a power amplifier (PA) 316. The BBF 310, the mixer 312, and the DA 314 may be included in a radio frequency integrated circuit (RFIC), while the PA 316 may be external to the RFIC. The BBF 310 filters the baseband signals received from the DAC 308, and the mixer 312 mixes the filtered baseband signals with a transmit local oscillator (LO) signal to convert the baseband signal of interest to a different frequency (e.g., upconvert from baseband to RF). This frequency conversion process produces the sum and difference frequencies of the LO frequency and the frequency of the signal of interest. The sum and difference frequencies are referred to as the beat frequencies. The beat frequencies are typically in the RF range, such that the signals output by the mixer 312 are typically RF signals, which may be amplified by the DA 314 and/or by the PA 316 before transmission by the antenna 303.

In certain aspects, a current-limiting circuit may be connected with the PA 316. Examples of such a current-limiting circuit are described below.

The RX path 304 includes a low noise amplifier (LNA) 322, a mixer 324, and a baseband filter (BBF) 326. The LNA 322, the mixer 324, and the BBF 326 may be included in a radio frequency integrated circuit (RFIC), which may or may not be the same RFIC that includes the TX path components. RF signals received via the antenna 303 may be amplified by the LNA 322, and the mixer 324 mixes the amplified RF signals with a receive local oscillator (LO) signal to convert the RF signal of interest to a different baseband frequency (i.e., downconvert). The baseband signals output by the mixer 324 may be filtered by the BBF 326 before being converted by an analog-to-digital converter (ADC) 328 to digital I or Q signals for digital signal processing.

Contemporary systems may employ frequency synthesizers with a voltage-controlled oscillator (VCO) to generate a stable, tunable LO with a particular tuning range. Thus, the transmit LO frequency may be produced by a TX frequency synthesizer 318, which may be buffered or amplified by amplifier 320 before being mixed with the baseband signals in the mixer 312. Similarly, the receive LO frequency may be produced by an RX frequency synthesizer 330, which may be buffered or amplified by amplifier 332 before being mixed with the RF signals in the mixer 324. For some aspects, a frequency synthesizer may be shared by the TX and the RX and/or by multiple TX and/or RX chains.

Example Current Limiter for a Power Amplifier

Design specifications such as ruggedness for handset power amplifiers (PAs) are very stringent, as it may be desirable for a PA (e.g., PA 316) to survive and function under high load mismatch (e.g., voltage standing wave ratio (VSWR) of 10:1), extreme temperatures, and high supply voltage (e.g., 4.5 V) while delivering high output power (e.g., up to 36 dBm, or about 4 watts). Such extreme conditions may lead to high voltage and/or current swings at the PA power transistor's collector and may potentially damage the circuit. To improve the ruggedness of the PA, certain aspects of the present disclosure provide techniques and apparatus for protecting the PA with a current-limiting protection circuit that limits the maximum current drawn by the PA power transistor (also referred to as the "power cell transistor"). This protection circuit may improve both ruggedness and stability of the PA.

Figure 4:
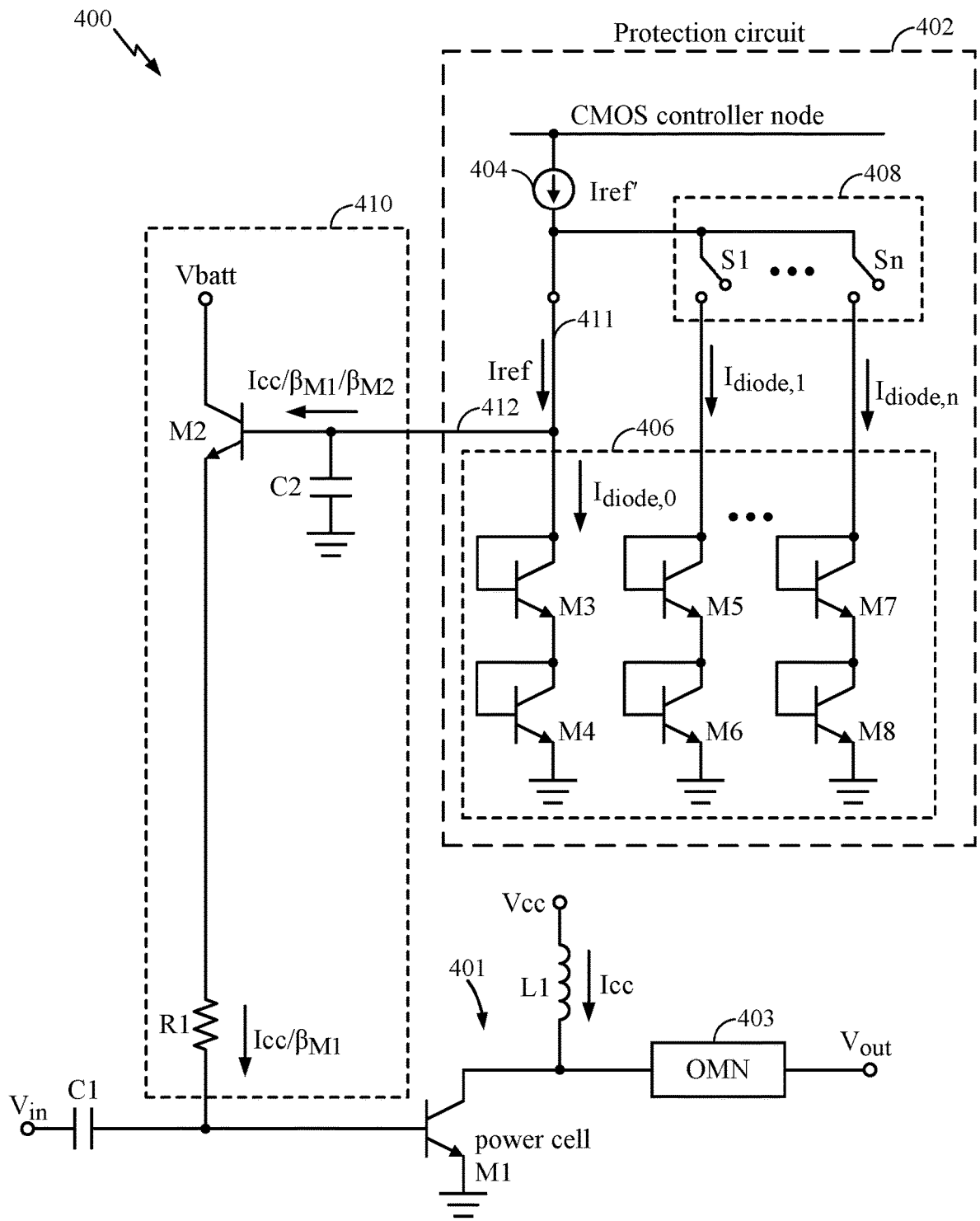
FIG. 4 is a circuit diagram of an example current-limiting protection circuit for a power amplifier, in accordance with certain aspects of the present disclosure.

FIG. 4 is a circuit diagram 400 of an example power amplifier 401 and supporting circuitry, including an example current-limiting protection circuit 402 for the power amplifier, in accordance with certain aspects of the present disclosure. The power amplifier 401 may include a transistor M1 (the power cell transistor). The collector of transistor M1 may be coupled to a power supply rail (Vcc) via an inductive element (e.g., inductor L1), as illustrated in FIG. 4. The base of transistor M1 may be coupled to an input voltage node (Vin) via an AC coupling capacitor C1, and the emitter of transistor M1 may be coupled to a reference potential node (e.g., electrical ground). For certain aspects, transistor M1 may be implemented by a heterojunction bipolar transistor (HBT) and/or be composed of gallium arsenide (GaAs). The output of the power amplifier 401 (e.g., the collector of transistor M1) may be coupled to an output voltage node (Vout) via an output impedance matching network (OMN) 403.

The protection circuit 402 may be coupled to or include a current source 404 configured to supply at least a reference current ($I_{ref}$) to a bias circuit 410 for the power amplifier 401. The current source 404 may source a current $I_{ref}'$ from which the reference current ($I_{ref}$) is supplied. For certain aspects, the current $I_{ref}'$ is supplied by a complementary metal-oxide-semiconductor (CMOS) controller. In this case, the current source 404 may be considered as part of the CMOS controller. In other aspects, the current source 404 is a separate circuit, which may be coupled to a node of the CMOS controller. A CMOS controller (or other logic controller) may be used to control various aspects of a radio frequency front-end (e.g., the transceiver front-end 300 of FIG. 3), such as the state of various switches to select different modes of operation (e.g., the switches in the interface 306, the frequency synthesizers 318, 330, the amplifiers 316, 322, and/or the BBFs 310, 326). The CMOS controller may in some cases may be located adjacent to the power amplifier 401. In some embodiments, the protection circuit 402, the bias circuit 410, and the power amplifier 401 are implemented together in a module. In some such implementations, the controller (e.g., the CMOS controller) is implemented separate from this module. In other embodiments, one or more of the bias circuit 410 and the protection circuit 402 are implemented separate from the power amplifier 401, for example as a separate component or in a separate module. In one such embodiment, the protection circuit 402 and the controller are implemented together.

The current $I_{ref}'$ for the protection circuit 402 may be configured to be substantially constant (e.g., having a suitable temperature and/or time drift, such as less than 5% over an operating temperature range) in certain aspects and/or modes. In some configurations, such constant operation simplifies the design and/or operation of the CMOS controller, for example in contrast to implementations in which $I_{ref}'$ is programmable to vary in order to account for linearity of the power amplifier 401.

Further, as illustrated in the example of FIG. 4, the protection circuit 402 includes: (1) an array of current-sinking devices 406, such as diode devices, and (2) an optional array of switches 408 coupled between the current source 404 and the array of current-sinking devices 406 (to enable different numbers of stacked diode devices). There may be n switches in the optional array of switches 408, labeled "S1" to "Sn," where n is any positive integer (including 1). The nominal reference current $I_{ref}'$ of the current source 404 may be configured to provide a fixed reference current, although $I_{ref}'$ may be temperature dependent. In such aspects, the current source 404 may be configured to provide a substantially constant current $I_{ref}'$ for each of a plurality of different temperatures and/or mode settings. The diode devices may be implemented by any of various suitable elements having a p-n junction, such as diodes or diode-connected transistors (e.g., double-stacked diode-connected transistors M3-M8, as shown in FIG. 4). The diode devices may be implemented with the same or different semiconductor technology (e.g., GaAs HBT) as the power cell transistor M1 of the power amplifier 401. For certain aspects, more or less than two diode devices may be connected serially in each of the stacks of the array of current-sinking devices 406 (described below). While each current-sinking device is illustrated in FIG. 4 as a pair of serially connected diode-connected transistors (e.g., the same current-sinking device in each stack), those having ordinary skill in the art will understand that one or more current-sinking devices may instead include different elements. For certain aspects, the array of switches 408 may be located on the CMOS controller die. Other examples of current-sinking devices include resistors, current source circuits used as current sinks, transistors, and the like.

The operation of the current-limiting protection circuit 402 is described below. When the power amplifier 401 is driven up by the input radio frequency (RF) power received at Vin, the collector current ($I_{cc}$) increases, and the base current of the power cell (transistor M1) is increased due to its self-rectification. The base current of transistor M1 can be expressed as $I_{cc}/\beta_1$, where $I_{cc}$ is the collector current and $\beta_{M1}$ is the beta of transistor M1. The base current of transistor M1 is supplied by the bias circuit 410, which is implemented in FIG. 4 as a buffer with an emitter follower topology comprising transistor M2 (e.g., an HBT), whose own base current may be approximated as $I_{cc}/\beta_{M1}/\beta_{M2}$. The collector of transistor M2 may be coupled to a power supply rail (e.g., Vbatt), the emitter of transistor M2 may be coupled to the base of transistor M1 via an impedance (e.g., including a resistive element, such as resistor R1), and the base of transistor M2 may be coupled to a node 412, representing the output of the protection circuit 402 and the input of the bias circuit 410. For certain aspects, a low-pass filter or a shunt capacitive element (e.g., capacitor C2) may be disposed between the node 412 and the base of transistor M2, to filter out high frequency signals (e.g., transients) from the output of the protection circuit 402.

The protection circuit 402 (e.g., via the CMOS controller) may operate based on a fixed reference current $I_{ref}'$, and $I_{ref}$ may be supplied from $I_{ref}'$. $I_{ref}$ may be split into the base current for transistor M2 and a forward current $I_{diode,0}$ through a stack of diode devices (e.g., diode-connected transistors M3 and M4). The maximum value of $I_{ref}$ is limited by the value of $I_{ref}'$. Because a limited $I_{ref}$ is supplied to node 412, the maximum base current of transistor M2—and as a result, the base current for transistor M1—is limited by $I_{ref}$. Therefore, the maximum power delivered by the power amplifier 401 is also limited. In some embodiments, certain such aspects may be referred to as a beta helper, and the current may be adjusted appropriately for operation of the beta helper/power cell as described herein. Current-limiting protection as described above may have an effect, for example, when the following condition occurs:
$I_{cc}/\beta_{M1}/\beta_{M2} > I_{ref}$.

$I_{ref}'$ may be set to satisfy certain conditions. For example, $I_{ref}'$ may be set to provide sufficient base current to meet the maximum power specification under nominal operating conditions. $I_{ref}'$ may also be set to ensure the power cell transistor M1 does not exceed the maximum current and/or voltage under extreme conditions (e.g., high temperatures).

Figure 5:
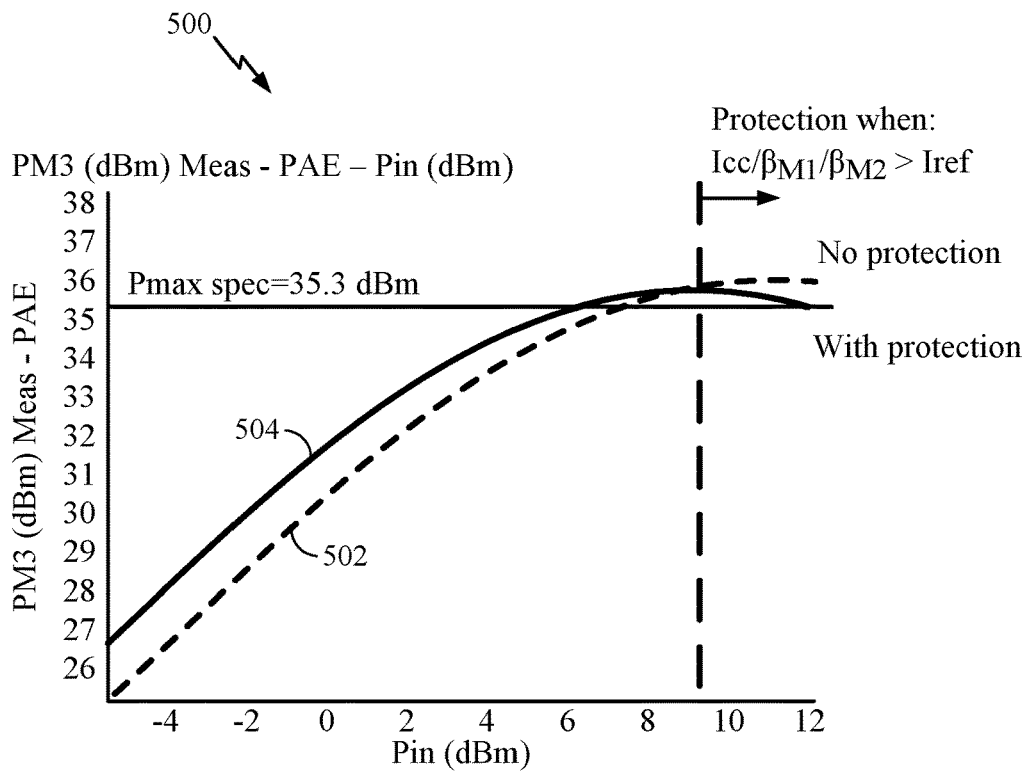
FIG. 5 is an example graph of output power versus input power for a power amplifier, comparing the protection circuitry being enabled and disabled, in accordance with certain aspects of the present disclosure.

FIG. 5 is an example graph 500 of output power versus input power for a power amplifier (e.g., power amplifier 401), comparing the same circuit, for testing purposes, when protection techniques as described above are implemented and not being implemented. The curve 502 represents protection not being implemented, while the curve 504 represents protection being implemented. The curve 504 shows the scenario where the maximum power is limited (e.g., current-limited) and the power starts to decrease when the power amplifier is over-driven. This over-driven behavior shown by the curve 504 may be due to the beta (β) of the power cell transistor changing as a function of temperature as the transistor heats up with increased power.

Returning to FIG. 4, because the reference current ($I_{ref}$) may be designed to deliver sufficient power at nominal conditions, additional degrees of freedom may be provided for certain aspects in an effort to adjust the quiescent current ($I_q$) to improve the linearity, gain, and/or efficiency of the power amplifier 401. For certain aspects, the ability to adjust $I_q (=I_{cc}/\beta_{M1})$ may be provided by the array of switches 408 between the current source 404 and at least some of the diode device stacks (e.g., those other than the diode device stack with diode-connected transistors M3 and M4). By connecting more diode device stacks (e.g., of double-stacked diodes) via the switches (S1 to Sn), more current is sunk from $I_{ref}'$ by forward currents ($I_{diode,1}$ to $I_{diode,n}$) through the various enabled stacks. Therefore, less $I_{ref}$ is supplied to current branch 411, less base current is supplied to transistor M2, and thus, less current is supplied to the base of the power cell (transistor M1), which determines the DC bias condition. This array of switches 408 may determine the DC bias for a given $I_{ref}'$ since the value of $I_{ref}'$ may be set based on the design specifications. In other words, for a given $I_{ref}'$, a particular number of switches in the array may be closed; if $I_{ref}'$ is changed, a different number of switches may be closed. Thus, the ability to adjust $I_{ref}$ and control the number of enabled diode device stacks may provide multiple degrees of freedom for protection and linearity considerations. For example, $I_{ref}'$ may be set for protection, for example in a certain mode or under certain conditions, whereas the number of enabled diode device stacks may be used to set $I_q$ and control the linearity of the power amplifier 401.

Figure 6:
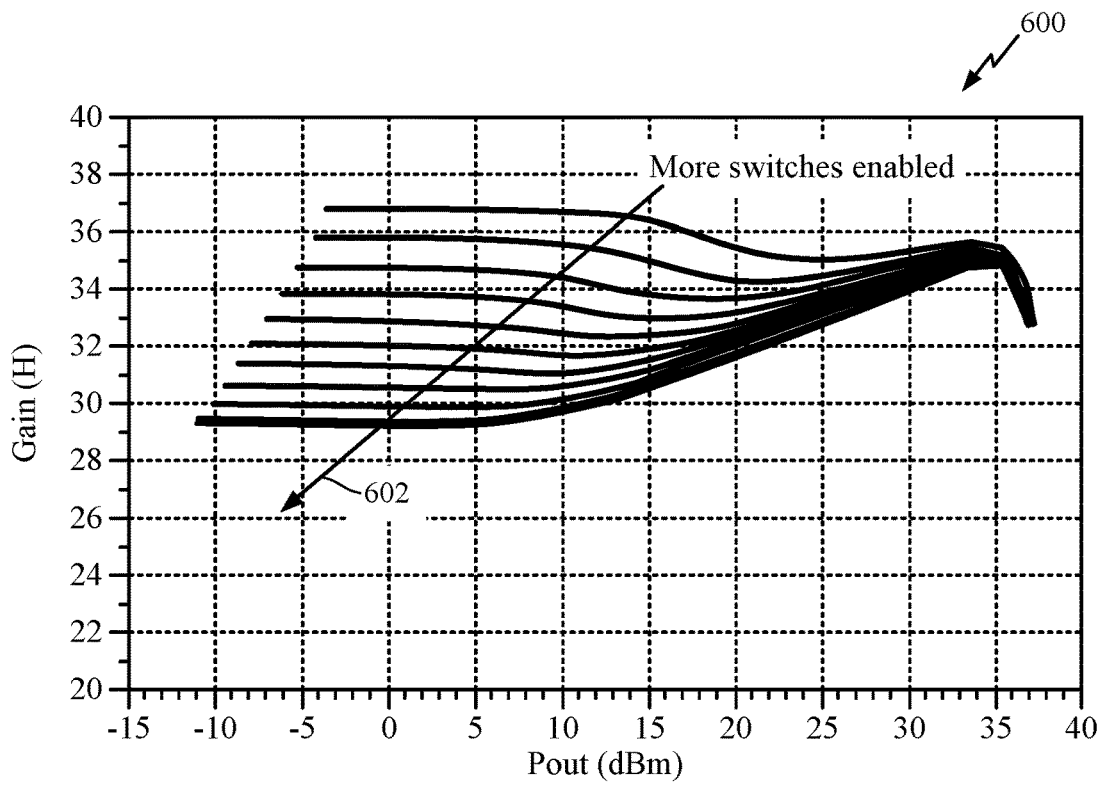
FIG. 6 is an example graph of gain versus output power with different numbers of double-stacked diodes enabled, in accordance with certain aspects of the present disclosure.

FIG. 6 is an example graph 600 of gain versus output power with different numbers of diode device stacks (e.g., double-stacked diodes) enabled, in accordance with certain aspects of the present disclosure. As shown by the trend line 602 in graph 600 for at least 10 different diode device stacks, as the number of enabled diode device stacks increases (e.g., as the number of switches being closed in the array of switches 408 increases), the gain decreases.

Beneficially, the current-limiting circuit may improve both ruggedness and stability under various power (e.g., different Vcc) and voltage standing wave ratio (VSWR) conditions.

Figure 7:
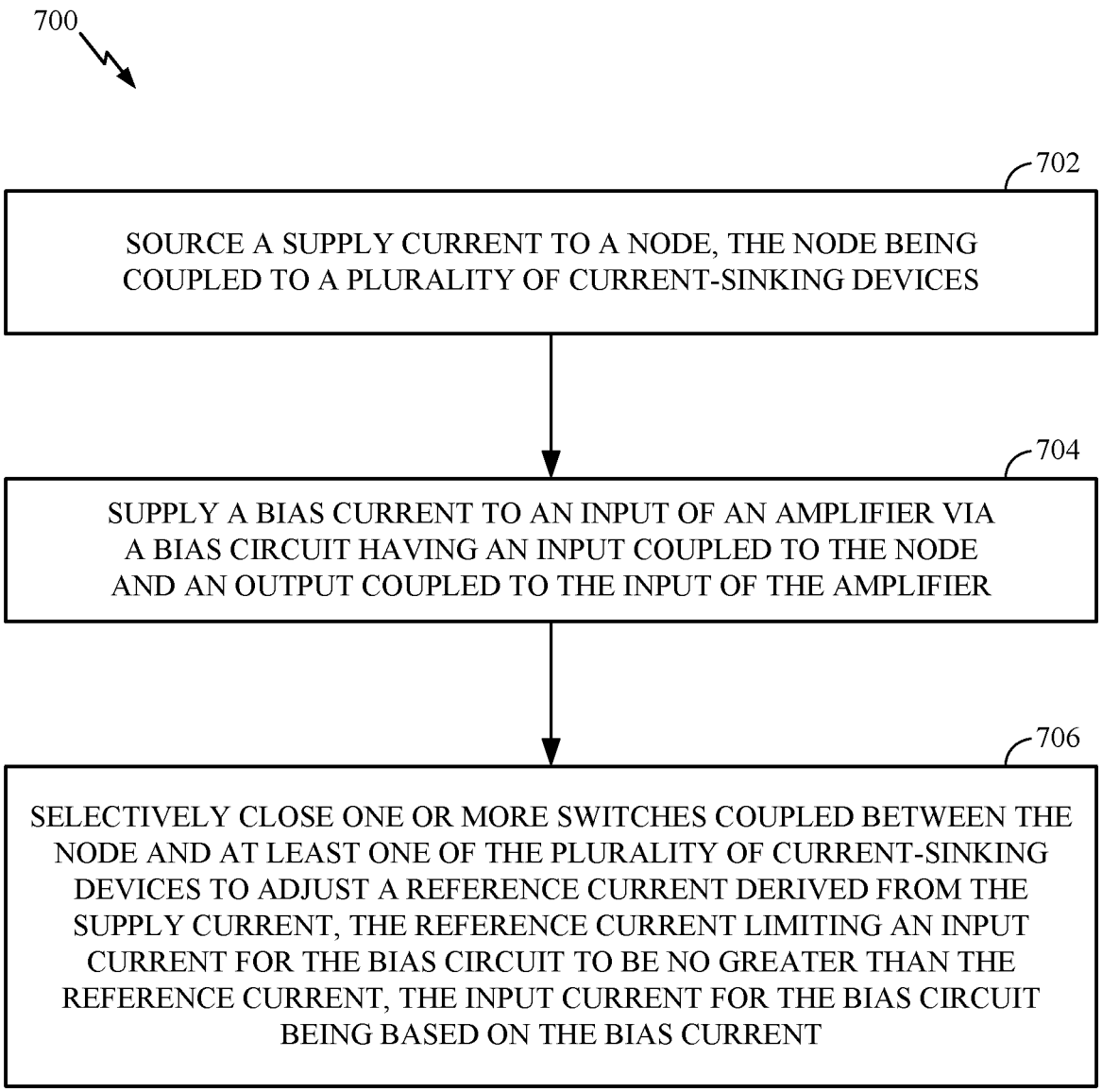
FIG. 7 is a flow diagram of example operations for current-limiting an amplifier, in accordance with certain aspects of the present disclosure.

FIG. 7 is a flow diagram of example operations 700 for current-limiting an amplifier (e.g., power amplifier 401), in accordance with certain aspects of the present disclosure. The operations 700 may be performed by a current-limiting circuit, such as the current-limiting protection circuit 402 of FIG. 4, for example in combination with a bias circuit, such as the bias circuit 410 of FIG. 4.

The operations 700 may begin at block 702 by sourcing a supply current (e.g., $I_{ref}'$) to a node (e.g., node 412). The node may be coupled to a plurality of current-sinking devices (e.g., the array of current-sinking devices 406). At block 704, a bias current ($I_q$) may be supplied to an input of the amplifier via a bias circuit (e.g., bias circuit 410) having an input coupled to the node and an output coupled to an input of the amplifier. At block 706, the circuit may selectively close one or more switches (e.g., switches S1 to Sn) coupled between the node and at least one of the plurality of current-sinking devices to adjust a reference current (e.g., $I_{ref}$) derived from the supply current. The reference current may limit an input current for the bias circuit to be no greater than the reference current. The input current for the bias circuit may be based on the bias current. For example, a certain amount of current will be drawn as the input current from the protection circuit 402 based on the bias current due to the beta of M2. Remaining current may be sunk by M3 and M4. This input current, however, cannot be greater than the reference current and therefore may be limited by the reference current in certain circumstances.

According to certain aspects, the amplifier comprises a transistor. In this case, the bias current may be a base current for the transistor and is proportional to a collector current for the transistor. For certain aspects, the transistor comprises an HBT.

According to certain aspects, the bias circuit includes a buffer implemented as an emitter follower. In this case, the emitter follower includes a transistor having a base coupled to the node, an emitter coupled to the input of the amplifier, and a collector for coupling to a power supply rail. For certain aspects, the input current for the bias circuit is a base current for the transistor. For certain aspects, the bias current is an emitter current for the transistor and is proportional to the base current according to a beta of the transistor. For certain aspects, the transistor comprises an HBT.

According to certain aspects, at least one of the plurality of current-sinking devices includes one or more diode devices. The one or more diode devices include a diode-connected transistor. For certain aspects, the diode-connected transistor is an HBT having a collector and a base coupled to the collector.

According to certain aspects, at least one of the plurality of current-sinking devices includes two diode devices connected in series.

According to certain aspects, at least one of the plurality of current-sinking devices is connected directly to the node (e.g., the diode device stack comprising M3 and M4).

According to certain aspects, the selectively closing at block 706 involves selectively closing a number of the one or more switches based on the supply current sourced to the node (e.g., an output current $I_{ref}$' from the current source 404).

According to certain aspects, the selectively closing at block 706 entails selectively closing a number of the one or more switches to adjust a linearity of the amplifier.

According to certain aspects, the sourcing at block 702 includes programming a current source (e.g., current source 404) to set the supply current. For certain aspects, the current source is configured to provide a substantially constant current.

According to certain aspects, the amplifier comprises a power amplifier configured to output radio frequency signals.

The various operations or methods described above may be performed by any suitable means capable of performing the corresponding functions. The means may include various hardware and/or software component(s) and/or module(s), including, but not limited to a circuit, an application specific integrated circuit (ASIC), or processor. Generally, where there are operations illustrated in figures, those operations may have corresponding counterpart means-plus-function components with similar numbering.

For example, means for amplifying a radio frequency signal may include a power amplifier, such as the power amplifier 316 depicted in FIG. 3 or the power amplifier 401 illustrated in FIG. 4. Means for supplying a substantially constant current may include a current source, such as the current source 404 portrayed in FIG. 4. Means for adjustably sinking current may include a plurality of means for selectively sinking the current, such as an array of current-sinking devices 406 coupled to an array of switches 408, as illustrated in FIG. 4. Means for biasing may include a biasing circuit, such as the biasing circuit 410 shown in FIG. 4 or a beta helper circuit.

As used herein, the term "determining" encompasses a wide variety of actions. For example, "determining" may include calculating, computing, processing, deriving, investigating, looking up (e.g., looking up in a table, a database, or another data structure), ascertaining, and the like. Also, "determining" may include receiving (e.g., receiving information), accessing (e.g., accessing data in a memory), and the like. Also, "determining" may include resolving, selecting, choosing, establishing, and the like.

As used herein, a phrase referring to "at least one of" a list of items refers to any combination of those items, including single members. As an example, "at least one of: a, b, or c" is intended to cover: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

It is to be understood that the claims are not limited to the precise configuration and components illustrated above. Various modifications, changes and variations may be made in the arrangement, operation and details of the methods and apparatus described above without departing from the scope of the claims.

What is claimed is:

1. A current-limiting circuit for an amplifier, comprising:
a node coupled to a current source;
a plurality of current-sinking devices coupled to the node;
one or more switches coupled between the node and at least one of the plurality of current-sinking devices; and
a bias circuit having an input coupled to the node via a first path and an output for coupling to an input of the amplifier, wherein the one or more switches are not disposed in the first path.

2. The circuit of claim 1, wherein the bias circuit comprises a buffer implemented as an emitter follower.

3. The circuit of claim 2, wherein the emitter follower comprises a transistor having a base coupled to the node, an emitter for coupling to the input of the amplifier, and a collector for coupling to a power supply rail for the circuit.

4. The circuit of claim 3, wherein the transistor comprises a heterojunction bipolar transistor (HBT).

5. The circuit of claim 1, wherein at least one of the plurality of current-sinking devices comprises one or more diode devices.

6. The circuit of claim 5, wherein the one or more diode devices comprise a diode-connected transistor.

7. The circuit of claim 6, wherein the diode-connected transistor comprises a heterojunction bipolar transistor (HBT) having a collector and a base coupled to the collector.

8. The circuit of claim 1, wherein at least one of the plurality of current-sinking devices comprises two diode devices connected in series.

9. A current-limiting circuit for an amplifier, comprising:
a node coupled to a current source;
a plurality of current-sinking devices coupled to the node;
one or more switches coupled between the node and at least one of the plurality of current-sinking devices; and
a bias circuit having an input coupled to the node and an output for coupling to an input of the amplifier,
wherein at least one of the plurality of current-sinking devices is connected directly to the node.

10. The circuit of claim 1, wherein a number of the one or more switches that are configured to be closed is dependent on an output current from the current source.

11. The circuit of claim 1, further comprising a resistive element having a first end coupled to the output of the bias circuit and a second end for coupling to the input of the amplifier.

12. The circuit of claim 1, wherein the current source is configured based on temperature.

13. The circuit of claim 1, wherein the current source is configured to provide a substantially constant current.

14. The circuit of claim 1, wherein the amplifier comprises a power amplifier configured to output radio frequency signals.

15. A method of current-limiting an amplifier, comprising:
sourcing a supply current to a node, the node being coupled to a plurality of current-sinking devices;
supplying a bias current to an input of the amplifier via a bias circuit having an input coupled to the node and an output coupled to the input of the amplifier; and selectively closing one or more switches coupled between the node and at least one of the plurality of current-sinking devices to adjust a reference current derived from the supply current, the reference current limiting an input current for the bias circuit to be no greater than the reference current, the input current for the bias circuit being based on the bias current and being drawn from the node without passing through the one or more switches.

16. The method of claim 15, wherein the amplifier comprises a transistor and wherein the bias current is a base current for the transistor and is proportional to a collector current for the transistor.

17. The method of claim 15, wherein:
the bias circuit comprises a buffer implemented as an emitter follower;
the emitter follower comprises a transistor having a base coupled to the node, an emitter coupled to the input of the amplifier, and a collector for coupling to a power supply rail;
the input current for the bias circuit is a base current for the transistor; and
the bias current is an emitter current for the transistor and is proportional to the base current according to a beta of the transistor.

18. The method of claim 17, wherein the transistor comprises a heterojunction bipolar transistor (HBT).

19. The method of claim 15, wherein at least one of the plurality of current-sinking devices comprises one or more diode devices.

20. The method of claim 19, wherein the one or more diode devices comprise a diode-connected transistor.

21. The method of claim 20, wherein the diode-connected transistor comprises a heterojunction bipolar transistor (HBT) having a collector and a base coupled to the collector.

22. A method of current-limiting an amplifier, comprising:
sourcing a supply current to a node, the node being coupled to a plurality of current-sinking devices;
supplying a bias current to an input of the amplifier via a bias circuit having an input coupled to the node and an output coupled to the input of the amplifier; and
selectively closing one or more switches coupled between the node and at least one of the plurality of current-sinking devices to adjust a reference current derived from the supply current, the reference current limiting an input current for the bias circuit to be no greater than the reference current, the input current for the bias circuit being based on the bias current,
wherein at least one of the plurality of current-sinking devices is connected directly to the node.

23. The method of claim 15, wherein the selectively closing comprises selectively closing a number of the one or more switches based on the supply current sourced to the node.

24. The method of claim 15, wherein the selectively closing comprises selectively closing a number of the one or more switches to adjust a linearity of the amplifier.

25. The method of claim 15, wherein the sourcing comprises configuring the supply current to establish a protection condition for the amplifier.

26. The apparatus of claim 1, wherein the current source is directly connected to the node.

* * * * *